(12) United States Patent
Bourstein et al.

(10) Patent No.: US 9,606,150 B1
(45) Date of Patent: Mar. 28, 2017

(54) SENSING ARRANGEMENT FOR SENSING A VOLTAGE FROM MULTIPLE VOLTAGE SOURCES

(71) Applicant: Marvell International Ltd., Hamilton (BM)

(72) Inventors: Ido Bourstein, Pardes Hana (IL); Leonid Tsukerman, Givat Shmuel (IL)

(73) Assignee: Marvell International Ltd., Hamilton (BM)

( * ) Notice: Subject to any disclaimer, the term of this patent is extended or adjusted under 35 U.S.C. 154(b) by 388 days.

(21) Appl. No.: 14/205,966

(22) Filed: Mar. 12, 2014

Related U.S. Application Data

(60) Provisional application No. 61/777,440, filed on Mar. 12, 2013.

(51) Int. Cl.
*H02J 1/00* (2006.01)
*G01R 19/00* (2006.01)

(52) U.S. Cl.
CPC ..... *G01R 19/0007* (2013.01); *G01R 19/0084* (2013.01)

(58) Field of Classification Search
CPC ............ Y10T 307/696; Y10T 307/724; G09G 2300/0408; G09G 2330/02; G09G 3/3611; H02J 1/08; H02J 1/10

USPC .................. 324/76.11, 713, 73.1; 307/80, 85
See application file for complete search history.

(56) References Cited

U.S. PATENT DOCUMENTS

| | | |
|---|---|---|
| 6,847,249 B1 | 1/2005 | Brokaw |
| 2003/0098616 A1 | 5/2003 | Wu et al. |
| 2008/0284251 A1* | 11/2008 | Lee ............................ H02J 1/10 307/80 |
| 2009/0102289 A1* | 4/2009 | Aipperspach ............. H02J 1/10 307/80 |
| 2009/0146499 A1 | 6/2009 | Takeda et al. |

* cited by examiner

*Primary Examiner* — Vincent Q Nguyen

(57) ABSTRACT

Some of the embodiments of the present disclosure provide an apparatus for sensing a voltage level of an output voltage that is selected from at least two voltage supplies, including: a maximum voltage generator circuit configured (i) to determine a voltage supply among the at least two voltage supplies that has a higher voltage level and (ii) to output a maximum voltage signal having a voltage level corresponding to the higher voltage level; and a sensing module configured to selectively sense the output voltages, the sensing module comprising a switch circuit configured to apply the maximum voltage signal to completely turn off supply of the output voltage when the output voltage is not to be sensed at the sensing module.

20 Claims, 6 Drawing Sheets

SENSING ARRANGEMENT FOR SENSING A VOLTAGE FROM MULTIPLE VOLTAGE SOURCES

CROSS REFERENCE TO RELATED APPLICATIONS

The present application claims priority to U.S. Provisional Patent Application No. 61/777,440, filed on Mar. 12, 2013, the entire specification of which is hereby incorporated by reference in its entirety for all purposes. The present application is related to U.S. patent application Ser. No. 13/711,420, filed on Dec. 11, 2012; to U.S. Provisional Patent Application No. 61/570,168, filed on Dec. 13, 2011; and to U.S. Provisional Patent Application No. 61/578,594, filed on Dec. 21, 2011, the entire specifications of which are hereby incorporated by reference in their entirety for all purposes.

TECHNICAL FIELD

Embodiments of the present disclosure relate to a sensing arrangement to sense a voltage, and more specifically, to a sensing arrangement for sensing a voltage from multiple voltage sources.

BACKGROUND

Unless otherwise indicated herein, the approaches described in this section are not prior art to the claims in the present disclosure and are not admitted to be prior art by inclusion in this section.

A sensing circuit may selectively sense a voltage from multiple voltage sources. As an example, during a first time period, the sensing circuit may sense a first voltage from a plurality of voltages; and during a second time period, the sensing circuit may sense a second voltage from the plurality of voltages. Selectively sensing voltages is achieved using switches that are configured to switch among voltages to be sensed. However, when there is more than one voltage to be sensed, it may not be possible to fully isolate the voltage to be sensed, using conventional switches. This drawback is particularly problematic when, for example, each of the voltages among a plurality of voltages to be sensed has a different voltage level.

SUMMARY

In various embodiments, the present disclosure provides a system comprising an apparatus for sensing a voltage level of an output voltage that is selected from at least two voltage supplies, comprising: a maximum voltage generator circuit configured (i) to determine a voltage supply among the at least two voltage supplies that has a higher voltage level and (ii) to output a maximum voltage signal having a voltage level corresponding to the higher voltage level; and a sensing module configured to selectively sense the output voltages, the sensing module comprising a switch circuit configured to apply the maximum voltage signal to completely turn off supply of the output voltage when the output voltage is not to be sensed at the sensing module.

In various embodiments, the present disclosure also provides a method comprising: receiving an output voltage that is selected from at least two voltage supplies; determining a voltage supply among the at least two voltage supplies that has a higher voltage level; generating a maximum voltage signal having a voltage level corresponding to the higher voltage level; using the maximum voltage signal in a switch circuit of a sensing module, selectively sensing the output voltage, such that the output voltage is completely turned off when the output voltage is not to be sensed at the sensing module.

BRIEF DESCRIPTION OF THE DRAWINGS

In the following detailed description, reference is made to the accompanying drawings which form a part hereof wherein like numerals designate like parts throughout. The drawings depict embodiments to illustrate principles of the present disclosure. It is noted that other embodiments may be utilized and structural or logical changes may be made without departing from the scope of the present disclosure. Therefore, the following detailed description is not to be taken in a limiting sense, and the scope of the present disclosure is defined by the appended claims and their equivalents.

DETAILED DESCRIPTION

Figure 1:
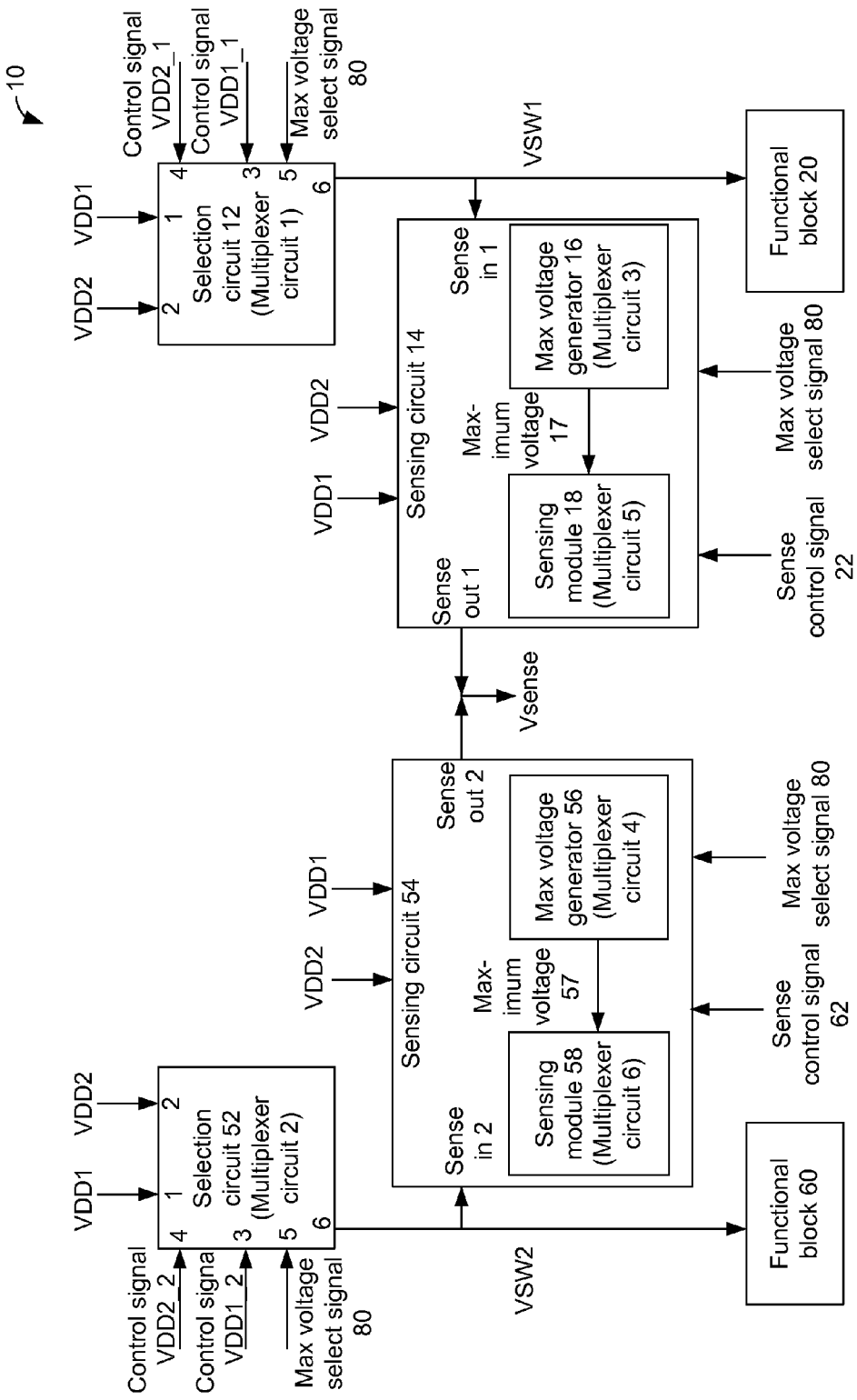
FIG. 1 schematically illustrates a system comprising sensing circuits for sensing voltages from multiple voltage sources.

FIG. 1 schematically illustrates a system 10 comprising selection circuits 12 and 52, sensing circuits 14 and 54, and functional blocks 20 and 60. In an embodiment, each of the selection circuits 12 and 52 receives at least two voltages VDD1 and VDD2. In some embodiments, the respective voltage levels of VDD1 and VDD2 are different from one another and vary over time. The selection circuit 12 selects one of the voltages VDD1 and VDD2, and outputs the selected voltage as VSW1, which is transmitted to the functional block 20. Similarly, the selection circuit 52 selects one of the voltages VDD1 and VDD2, and outputs the selected voltage as VSW2, which is transmitted to the functional block 60. The sensing circuit 14 receives the voltage VSW1, selectively senses the voltage VSW1, and outputs the sensed voltage as Vsense. Similarly, the sensing circuit 54 receives the voltage VSW2, selectively senses the voltage VSW2, and outputs the sensed voltage as Vsense. In an embodiment, at any given time, at most one of the sensing circuits 14 and 54 outputs the voltage Vsense (i.e., at any given time, at most only one of the voltages VSW1 and VSW2 is output as Vsense by the sensing circuits 14 and 54).

In an embodiment and as will be discussed in greater detail herein below, the sensing circuit 14 comprises a maximum voltage generator 16 configured to receive the voltages VDD1 and VDD2, and receive a max voltage select signal 80 that indicates which of the voltages VDD1 and VDD2 has a higher voltage level. The maximum voltage generator 16 is further configured to generate a maximum voltage 17 having a voltage level corresponding to a higher voltage level of one of the voltages VDD1 and VDD2. For example, if at any given time, if VDD1 is higher than VDD2, then the maximum voltage 17 corresponds to VDD1 which has a higher voltage level, and vice versa. The sensing circuit 14 further comprises a sensing module 18 configured to receive the maximum voltage 17, a sense control signal 22, and the voltage VSW1; and using the maximum voltage 17, output the voltage VSW1 as Vsense based on a state of the sense control signal 22. In a similar manner to the circuit 14, the sensing circuit 54 comprises a max voltage generator 56 (which, for example, operates similarly to the max voltage generator 16 to generate a maximum voltage 57) and a sensing module 58 (which, for example, operates similarly to the sensing module 18). As will be discussed herein below, using the maximum voltages 17 and 57 to respectively generate the Vsense from the voltages VSW1 and VSW2 results in, for example, minimal or no leakage current in the sensing modules 18 and 58 while generating the Vsense. For example, using the maximum voltage 17 in the sensing module 18 ensures that while the voltage VSW1 is not to be sensed as the voltage Vsense, the voltage VSW1 is not leaked in the Vsense pin. Similarly, using the maximum voltage 57 in the sensing module 58 ensures that while the voltage VSW2 is not to be sensed as the voltage Vsense, the voltage VSW2 is not leaked in the Vsense pin. Thus, a single Vsense pin can be used to selectively sense the voltages VSW1 and VSW2 (as no unintended leakage of either of the voltages VSW1 or VSW2 occurs in the Vsense pin).

In an embodiment, the functional blocks 20 and 60 can be any appropriate functional blocks that require one of a plurality of voltage levels (e.g., voltages VDD1, VDD2) as an input. Merely as an example, each of the functional blocks 20 and 60 is an appropriate type of a memory device, or any other appropriate type of electronic device that selectively requires one of a plurality of specific voltage levels as an input. Although each functional block 20 and 60 are illustrated in FIG. 1 to receive one of only two voltages VDD1 and VDD2, in an embodiment, each functional block 20 and 60 may receive one of more than two voltages.

Referring again to the selection circuit 12, the selection circuit 12 receives, apart from the voltages VDD1 and VDD2, the max voltage select signal 80, a control signal VDD1_1 and a control signal VDD2_1. The selection circuit 12, using the max voltage select signal 80, selects and outputs one of the voltages VDD1 and VDD2 as the voltage VSW1, based on the states of the control signals VDD1_1 and VDD2_1. For example, if the control signal VDD1_1 is enabled, the selection circuit 12 outputs the voltage VDD1 as the voltage VSW1; and if the control signal VDD1_2 is enabled, the selection circuit 12 outputs the voltage VDD2 as the voltage VSW1. The selection circuit 52 operates in a similar manner, and receives the voltages VDD1 and VDD2, the max voltage select signal 80, a control signal VDD1_2 and a control signal VDD2_2. The selection circuit 52, using the max voltage select signal 80, selects and outputs one of the voltages VDD1 and VDD2 as the voltage VSW2, based on the states of the control signals VDD1_2 and VDD2_2.

In an embodiment and as will be discussed in more detail herein below, each of the selection circuits 12 and 52, the maximum voltage generators 16 and 56, and the sensing modules 18 and 58 comprises a corresponding multiplexer circuit (labeled as multiplexer circuits 1, . . . , 6, respectively, in FIG. 1). For example, the selection circuit 12 is implemented as multiplexer circuit 1, the selection circuit 52 is implemented as multiplexer circuit 2, the maximum voltage generator 16 is implemented as multiplexer circuit 3, and so on, as will be discussed in more detail herein below. In an embodiment, each of the multiplexer circuits 1, . . . , 6 have substantially similar structure and configuration, as will be discussed in more detail herein below. Various input/output terminals of some of these multiplexer circuits are labeled as 1, . . . , 6 in FIG. 1.

Figure 2:
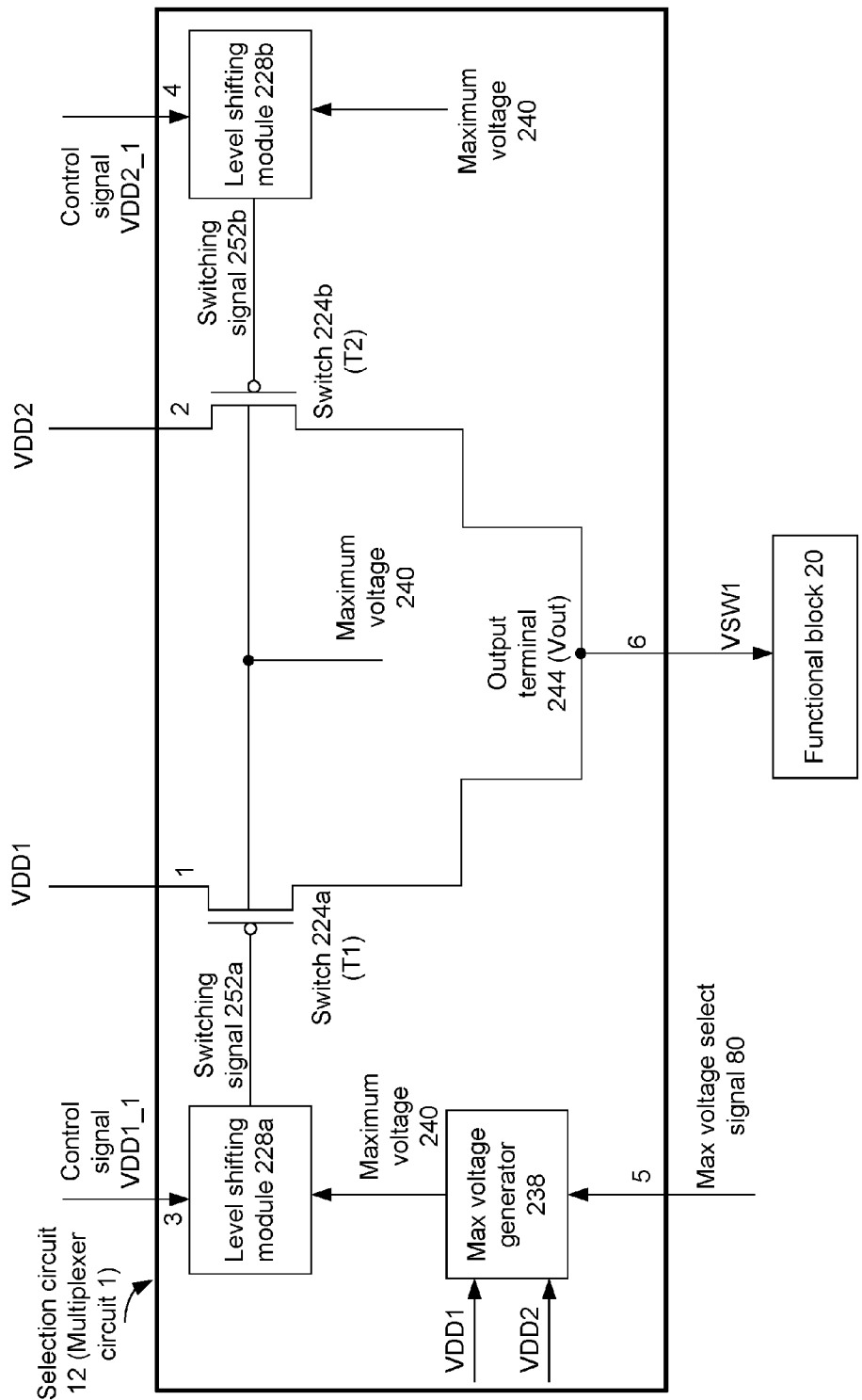
FIG. 2 schematically illustrates an example implementation of a selection circuit.

FIG. 2 schematically illustrates an example implementation of the selection circuit 12, which comprises the multiplexer circuit 1. The selection circuit 12 receives, at terminals 1 and 2, the voltages VDD1 and VDD2, respectively. The selection circuit 12 also receives, at terminals 3 and 4, the control signals VDD1_1 and VDD2_1, respectively. The selection circuit 12 receives, at terminal 5, the max voltage select signal 80. The selection circuit 12 outputs, at terminal 6, the voltage VSW1.

The selection circuit 12, which comprises the multiplexer 1, is discussed in detail in co-pending U.S. patent application Ser. No. 13/711,420 the entire specification of which is hereby incorporated by reference in its entirety.

In an embodiment, the max voltage select signal 80 indicates which of the voltages received at terminals 1 and 2 (i.e., the voltages VDD1 and VDD2) of the multiplexer circuit 1 has a higher voltage level. For example, a high logical level of the max voltage select signal 80 indicates that the voltage VDD1 is higher than the voltage VDD2; and a low logical level of the max voltage select signal 80 indicates that the voltage VDD2 is higher than the voltage VDD1. Generation of the max voltage select signal 80 is discussed in detail in co-pending U.S. patent application Ser. No. 13/711,420.

In an embodiment, the selection circuit 12 comprises a plurality of switches 224a, 224b that are controlled by a corresponding plurality of switching signals. In the example of FIG. 2, the switches 224a, 224b comprises P-channel metal oxide semiconductor field effect transistors (MOSFET) T1 and T2, respectively (although in other embodiments, the switches 224a and/or 224b may comprise one or more other types of transistors). In the example of FIG. 2, the switch 224a is controlled by a switching signal 252a to selectively supply the voltage VDD1 to the output VSW1, and similarly the switch 224b is controlled by a switching signal 252b to selectively supply the voltage VDD2 to the output VSW1. For example, the switching signals 252a and 252b are respectively coupled to the control terminals (e.g., gate terminals) of the transistors T1 and T2, the voltages VDD1 and VDD2 are respectively coupled to the source terminals of the transistors T1 and T2, and an output terminal 244 (e.g., which is coupled to the terminal 6 of the selection circuit 12) is coupled to the drain terminals of the transistors T1 and T2.

Supply of the respective switching signals 252a and 252b are governed by respective control signals VDD1_1 and VDD2_1. Typically, the control signals VDD1_1 and VDD2_1 are provided so that any given time, only one (or none) of the switches 224a and 224b are turned on (so that at any given time, at most only one of the voltages VDD1 and VDD2 can be output as voltage VSW1).

In an embodiment, the selection circuit 12 comprises a max voltage generator 238 configured to receive the voltages VDD1, VDD2, and the max voltage select signal 80. The max voltage generator 238 outputs a maximum voltage 240 that has a voltage level corresponding to a highest voltage among the voltages VDD1 and VDD2. For example, when the max voltage select signal 80 is high (i.e. when VDD1>VDD2), the maximum voltage 240 is equal to the voltage level of the voltage VDD1; and when the max voltage select signal 80 is low (i.e., when VDD2>VDD1), the maximum voltage 240 is equal to the voltage level of the voltage VDD2. Thus, in an embodiment, the max voltage generator 238 selectively outputs one of the voltages VDD1 and VDD2 (or a voltage that is substantially equal to one of the voltages VDD1 and VDD2) as the maximum voltage 240, based on the max voltage select signal 80. The max voltage generator 238 is discussed in detail in co-pending U.S. patent application Ser. No. 13/711,420.

In an embodiment, each of the switching signals 252a, 252b is respectively output by level shifting modules 228a, 228b. Each of the level shifting modules 228a, 228b receives (i) a corresponding control signal (e.g., the level shifting module 228a receives the control signal VDD1_1, and the level shifting module 228b receives the control signal VDD2_1) and (ii) the maximum voltage 240. In an embodiment, the level shifting module 228a is configured to cause the respective switching signal 252a to have a voltage value that is one of (i) a ground voltage (e.g., if the control signal VDD1_1 has a high logical value), and (ii) the maximum voltage 240 (e.g., if the control signal VDD1_1 has a low logical value). Similarly, the level shifting module 228b is configured to cause the respective switching signal 252b to have a voltage value that is one of (i) the ground voltage (e.g., if the control signal VDD2_1 has a high logical value), and (ii) the maximum voltage 240 (e.g., if the control signal VDD1_1 has a low logical value).

For example, if the switch 224a is to be turned on and the switch 224b is to be turned off (i.e., if voltage VDD1 is to be supplied as the voltage VSW1 and thus has a level that needs to be sensed), then the switching signal 252a is driven to the ground voltage (e.g., by the corresponding level shifting module 228a based on the control signal VDD1_1), and the switching signal 252b is driven to the maximum voltage 240 (e.g., by the corresponding level shifting module 228b based on the control signal VDD2_1), e.g., assuming that the switches 224a and 224b comprises P type transistors. Driving the switching signal 252b to specifically the maximum voltage 240 (e.g., instead of any other sub-maximum voltage level), in an embodiment, ensures that the switch 224b is fully switched off (e.g., prevents partial switching off of the switch 224b). This is because, using the maximum voltage 240 for the switching signal 252b ensures that the voltage at the gate terminal of the transistor T2 is at a voltage that is always equal to or higher than the voltages at the source and drain terminals of the transistor T2, thereby ensuring full turning off of the transistor T2.

Turning the transistor T2 fully off prevents current from leaking from a power source supplying the voltage VDD1 (e.g., from terminal 1 of the selection circuit 12), through the partially off switch 224b, towards a power source supplying the voltage VDD2 (e.g., towards terminal 2 of the selection circuit 12). That is, by generating the switching signals 252a and 252b at one of the ground voltage and the maximum voltage 240 (e.g., instead of one of the ground voltage and any other voltage level), the selection circuit 12 ensures minimal or no leakage through ones of the switches 224a and 224b, while ones of the switches 224a and 224b are turned off. Switching of the switches 224a and 224b is discussed in further detail in co-pending U.S. patent application Ser. No. 13/711,420.

In an embodiment, the N-wells of the P-channel transistors T1 and T2 of each of the switches 224a and 224b are coupled to the maximum voltage 240. Coupling, for example, the N-well of the switch 224a to the maximum voltage 240 ensures that the N-well is at a voltage that is always equal to or higher than the voltages at the source and drain terminals of the switch 224a. This prevents leakage through any parasitic diode formed between (i) the N-well and (ii) one of the source and drain terminals of the switch 224a and 224b.

Table 1 below illustrates a truth table for steady state operation of the selection circuit 12 (i.e., the multiplexer circuit 1).

TABLE 1

| Terminal 1 (VDD1) | Terminal 2 (VDD2) | Terminal 3 (Control signal VDD1_1) | Terminal 4 (Control signal VDD2_1) | Terminal 5 (Max. voltage selection signal 80) | Terminal 6 (Output VSW1) |
|---|---|---|---|---|---|
| 0.9 V | 1.5 V | 1 | 0 | 0 | 0.9 V (VDD1) |
| 0.9 V | 1.5 V | 0 | 1 | 0 | 1.5 V (VDD2) |
| 1.8 V | 1.2 V | 1 | 0 | 1 | 1.8 V (VDD1) |
| 1.8 V | 1.2 V | 0 | 1 | 1 | 1.2 V (VDD2) |

Referring to the first and second rows of table 1, if voltage VDD1 at terminal 1 of the selection circuit is, for example, 0.9V, and if voltage VDD2 at terminal 2 of the selection circuit is, for example, 1.5V, then the maximum voltage selection signal 80 at terminal 5 is at logical value 0 (indicating that VDD1<VDD2). Also referring to the third and fourth rows of table 1, if voltage VDD1 at terminal 1 of the selection circuit is, for example, 1.8V, and if voltage VDD2 at terminal 2 of the selection circuit is, for example, 1.2V, then the maximum voltage selection signal 80 at terminal 5 is at logical value 1 (indicating that VDD1>VDD2). Furthermore, as previously discussed, the control signals VDD1_1 and VDD2_1 at terminals 3 and 4, respectively, are complimentary in nature—i.e., if one has a value 0, the other has a value 1. Moreover, the output VSW1 at terminal 6 is equal to the voltage level of the voltage VDD1 if the control signal VDD1_1 has a value of 1; and the output VSW1 at terminal 6 is equal to the voltage level of the voltage VDD2 if the control signal VDD1_2 has a value of 1.

Referring again to FIG. 1, the selection circuit 52 has a structure and operation that are substantially similar to those of the selection circuit 12, as discussed with respect to FIG. 2. Accordingly, a more detailed description of the selection circuit 52 is not provided herein.

Figure 3:
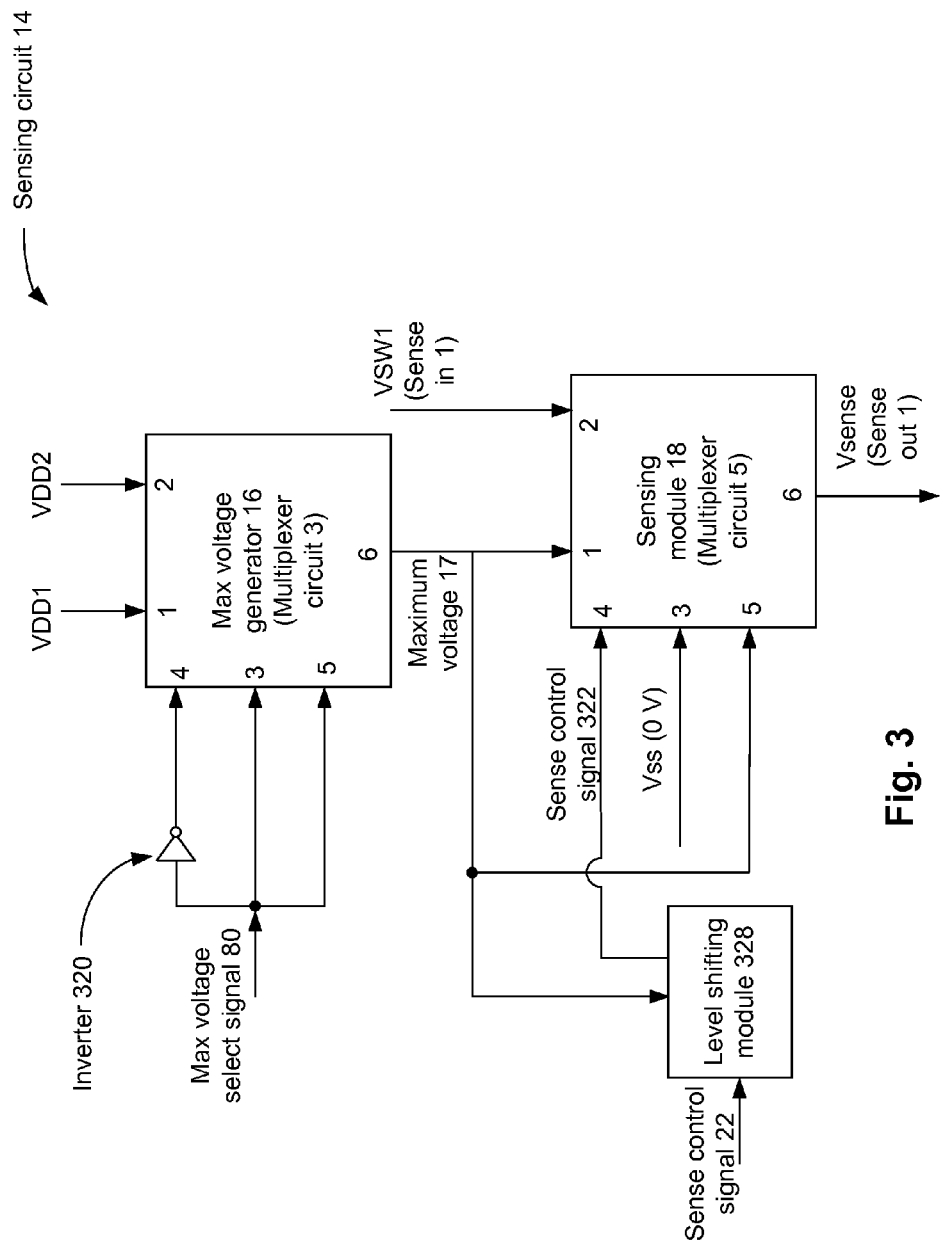
FIG. 3 schematically illustrates an example implementation of a sensing circuit.

FIG. 3 schematically illustrates an example implementation of the sensing circuit 14, which comprises the maximum voltage generator 16 and the sensing module 18. As previously discussed, each of the selection circuits 12 and 52, the maximum voltage generators 16 and 56, and sensing modules 18 and 58 comprises a corresponding multiplexer circuit (labeled as multiplexer circuits 1, . . . , 6 in FIGS. 1 and 3). For example, as illustrated in FIG. 3, the maximum voltage generator 16 comprises the multiplexer circuit 3, and the sensing module 18 comprises the multiplexer circuit 5. In an embodiment, each of the multiplexer circuits 3 and 5 of FIG. 3 have substantially structure as and configuration as the multiplexer circuit 1 (i.e., the selection circuit 12) of FIG. 2. For example, each of the multiplexer circuits 1, 3 and 5 of FIGS. 2 and 3 have corresponding six terminals, labeled as terminals 1, . . . , 6 in FIGS. 2 and 3.

Referring again to FIG. 3, the maximum voltage generator 16 (i.e., the multiplexer 3) receives voltages VDD1 and VDD2 in terminals 1 and 2, respectively; receives the max voltage select signal 80 in terminals 3 and 5; receives an inverse of the max voltage select signal 80 (e.g., as inverted by an inverter 320 in FIG. 3) in the terminal 4; and outputs the maximum voltage 17 in terminal 6.

Table 2 below illustrates a truth table for steady state operation of the multiplexer circuit 3 (i.e., the maximum voltage generator 16). Table 2 can be generated directly from table 1 and/or from FIG. 2 (as the multiplexer circuits 1 and 3 have similar circuit configuration).

TABLE 2

| Terminal 1 (VDD1) | Terminal 2 (VDD2) | Terminal 3 (Max. voltage selection signal 80) | Terminal 4 (Inverse of Max. voltage selection signal 80) | Terminal 5 (Max. voltage selection signal 80) | Terminal 6 (maximum voltage 17) |
|---|---|---|---|---|---|
| 0.9 V | 1.5 V | 0 | 1 | 0 | 1.5 V (VDD2) |
| 1.8 V | 1.2 V | 1 | 0 | 1 | 1.8 V (VDD1) |

Referring to the first row of table 2, if voltage VDD1 at terminal 1 of the multiplexer circuit 3 (i.e., the maximum voltage generator 16) is, for example, 0.9 V, and if voltage VDD2 at terminal 2 of the multiplexer circuit 3 is, for example, 1.5 V, then the maximum voltage selection signal 80 at terminals 3 and 5 of the multiplexer circuit 3 is at logical value 0 (indicating that VDD1<VDD2), and the inverse of the maximum voltage selection signal 80 at terminal 4 of the multiplexer circuit 3 is at logical value 1. Accordingly, the output maximum voltage 17 is 1.5 V, i.e., corresponding to voltage level of the voltage VDD2.

Also, referring to the second row of table 2, if voltage VDD1 at terminal 1 of the multiplexer circuit 3 (i.e., the maximum voltage generator 16) is, for example, 1.8V, and if voltage VDD2 at terminal 2 of the multiplexer circuit 3 is, for example, 1.2V, then the maximum voltage selection signal 80 at terminals 3 and 5 of the multiplexer circuit 3 is at logical value 1 (indicating that VDD1>VDD2), and the inverse of the maximum voltage selection signal 80 at terminal 4 of the multiplexer circuit 3 is at logical value 0. Accordingly, the output maximum voltage 17 is 1.8 V, i.e., corresponding to voltage level of the voltage VDD1.

Thus, the multiplexer circuit 3 (i.e., the maximum voltage generator 16) generates the maximum voltage 17 having a voltage level corresponding to a higher of the voltages VDD1 and VDD2, as seen from the table 2.

It is noted that the multiplexer circuit 1 of FIG. 2 (and also the multiplexer circuits 2, . . . , 6) has a max voltage generator 238, which is discussed in detail in co-pending U.S. patent application Ser. No. 13/711,420. However, the max voltage generator 238 has relatively low driving power. In contrast, when the multiplexer circuit 3 is configured as the maximum voltage generator 16 to generate the maximum voltage 17 (e.g., as illustrated in FIG. 3), the generated maximum voltage 17 has a relatively high driving power. As illustrated in FIG. 3, such a high driving power of the maximum voltage 17 is used to drive the sensing module 18. Furthermore, although FIG. 3 illustrates the multiplexer 3 being configured as the maximum voltage generator 16, in another embodiment, any other appropriate circuit can be used for the maximum voltage generator 16 to generate the maximum voltage 17.

As illustrated in FIGS. 1 and 3, the sensing circuit 14 comprises the sensing module 18, which comprises the multiplexer circuit 5. As previously discussed, the multiplexer circuit 5 is substantially similar to the multiplexer circuit 1 (i.e., the selection circuit 12) of FIG. 2. For example, each of the multiplexer circuits 1 and 5 of FIGS. 2 and 3 have corresponding six terminals, labeled as terminals 1, . . . , 6 in FIGS. 2 and 3.

The sensing module 18 receives the maximum voltage 17 from the maximum voltage generator 16 in terminals 1 and 5 of the multiplexer circuit 5. The sensing module 18 further receives, in terminal 2 of the multiplexer circuit 5, the voltage VSW1 as a sense 1 input from the selection circuit 12. The sensing module 18 further receives, in terminal 3 of the multiplexer circuit 5, a voltage Vss, which may be, for example, a ground voltage or have a voltage level of 0 V (or a relatively low voltage level).

In an embodiment, the sensing circuit 14 further comprises a level shifting module 328 configured to receive the sense control signal 22 and the maximum voltage 17. As will be discussed in detail herein below, the sensing circuit 14 selectively senses the voltage VSW1 (e.g., outputs the voltage VSW1 as voltage Vsense, illustrated as sense out 1 signal in FIGS. 1 and 3), based on the state of the sense control signal 22. For example, when the sense control signal 22 has a high logical value, the sensing circuit 14 senses the voltage VSW1 (e.g., outputs the voltage VSW1 as voltage Vsense). On the other hand, when the sense control signal 22 has a low logical value, the sensing circuit 14 refrains from sensing the voltage VSW1 (i.e., the output of the sensing circuit 14 is floating, and the sensing circuit 14 is in a high impedance state).

In an embodiment, using the maximum voltage 17, the level shifting module 328 generates a sense control signal 322, based on the logical state of the sense control signal 22. For example, when the sense control signal 22 is at a high logical value (i.e., is 1), the level shifting module 328 outputs the maximum voltage 17 as the sense control signal 322. On the other hand, when the sense control signal 22 is at a low logical value (i.e., is 0), the level shifting module 328 outputs a low logical value (i.e., is 0) as the sense control signal 322.

Table 3 below illustrates a truth table for steady state operation of the multiplexer circuit 5 (i.e., the sensing module 18) of FIG. 3. Table 3 can be generated directly from table 1 and/or from the multiplexer circuit 1 of FIG. 2 (as the multiplexer circuits 1 and 5 have similar circuit configuration).

TABLE 3

| Terminal 1 (max. voltage 17) | Terminal 2 (VSW1) | Terminal 3 (Vss (0V)) | Sense control 22 | Terminal 4 (Sense control 322) | Terminal 5 (maximum voltage 17) | Terminal 6 (Sense out 1) |
|---|---|---|---|---|---|---|
| 1.5 V | 0.9 V | 0 | 0 | 0 | 1.5 V | Floating |
| 1.5 V | 1.5 V | 0 | 0 | 0 | 1.5 V | Floating |
| 1.5 V | 0.9 V | 0 | 1 | 1.5 V (high logical value) | 1.5 V | 0.9 V |
| 1.5 V | 1.5 V | 0 | 1 | 1.5 V (high logical value) | 1.5 V | 1.5 V |

Table 3 illustrates various example values of the maximum voltage 17 and the voltage VSW1. For example, consider a scenario in which voltages VDD1 and VDD2 are 1.5 V and 0.9 V, respectively. Accordingly, the maximum voltage 17 is 1.5 V (i.e., as generated by the maximum voltage generator 16), as illustrated in table 3 above. Furthermore, the selection circuit 12 can select one of the voltages VDD1 and VDD2, and output the selected voltage as VSW1 (e.g., which is received at terminal 2 of the sensing module 18). In a first example, the selection circuit 12 selects the voltage VDD1 (which is at 1.5 V), and outputs the selected voltage VDD1 as VSW1, as illustrated in rows two and four of the table 3 above. In a second example, the selection circuit 12 selects the voltage VDD2 (which is at 0.9 V), and outputs the selected voltage VDD2 as VSW1, as illustrated in rows one and three of the table 3 above.

As previously discussed, terminal 3 of the sensing module 18 receives the voltage Vss, which is at 0 V (e.g., coupled to a ground voltage terminal), as illustrated in table 3 above.

Furthermore, as previously discussed, the sense control signal 22 can have logical value of either 0 (e.g., as illustrated in the first two rows of the table 3), or 1 (e.g., as illustrated in the last two rows of the table 3). When the sense control signal 22 has a logical value of 0, the sense control signal 322 generated by the level shifting module 328 is also at logical value 0 (e.g., as illustrated in the first two rows of the table 3). On the other hand, when the sense control signal 22 has a logical value of 1, the sense control signal 322 generated by the level shifting module 328 is at a voltage level of the maximum voltage 17 (e.g., as illustrated in the last two rows of the table 3), which is equivalent to being at a logical value of 1.

As previously discussed, the multiplexer circuit 5 of the sensing module 18 of FIG. 3 is similar to the multiplexer circuit 1 of the selection circuit 12 of FIG. 2. Thus, similar to the switches 224, 224b in the multiplexer circuit 1 of the selection circuit 12 of FIG. 2, the multiplexer circuit 5 of the sensing module 18 of FIG. 3 also has two corresponding switches. One of these two switches of the multiplexer circuit 5 of the sensing module 18 of FIG. 3 will be off when sense control signal 322 is 0; and another of the two switches of the multiplexer circuit 5 of the sensing module 18 of FIG. 3 is always off (as the voltage Vss received at terminal 3 is always 0). Thus, when the sense control signal 22 (and accordingly, the sense control signal 322) is at logical level 0, both these switches are off, and the sensing module 18 does not output anything, i.e., the output of the sensing module 18 at terminal 6 is floating, as illustrated in the first two rows of the table 3. On the other hand, when the sense control signal 22 (and accordingly, the sense control signal 322) is at the voltage level of the maximum voltage 17 (i.e., at the logical level 1), one of the two switches (i.e., the switch which receives the voltage VSW1) is on, and the sensing module 18 outputs the voltage VSW1 at terminal 6 of the sensing module 18, as illustrated in the last two rows of the table 3.

Thus, as illustrated in table 3, the sensing circuit 14 outputs the voltage VSW1 as the voltage Vsense when the sense control signal 22 is at a high logical value, and the sensing circuit 14 does not output anything (i.e., the output is floating) when the sense control signal 22 is at a low logical value. The sensing circuit 54 of FIG. 1 also operates in a similar manner. For example, the sensing circuit 54 outputs the voltage VSW2 as the voltage Vsense when the sense control signal 62 is at a high logical value, and the sensing circuit 54 does not output anything (i.e., the output is floating) when the sense control signal 62 is at a low logical value. The sense control signals 22 and 62 are controlled such that at most one of the sense control signals 22 and 62 can be high at any given time. Thus, at any given time, the system 10 selectively senses one of the voltages VSW1 or VSW2 at the single Vsense pin. That is, at any given time, the system 10 can selectively output one of the voltages VSW1 or VSW2 as the voltage Vsense, based on the respective states of the sense control signals 22 and 62.

As previously discussed, each of the multiplexer circuits 1, . . . , 6 have similar structures, which in an embodiment are a modular structure. Such similar structure of the multiplexer circuits 1, . . . , 6 simplifies the design of the system 10. Furthermore, as previously discussed, the use of the maximum voltage of the two voltages VDD1 and VDD2 in various circuits of the system 10 results in complete or full shut off of various switches in each of the multiplexer circuits 1, . . . , 6, thereby resulting in reduction of leakage currents in the system 10. For example, similar to the P-channel transistor T2 (i.e., the switch 224b) of the multiplexer circuit 1 of FIG. 2, the sensing module 18 (i.e., the multiplexer circuit 5) also comprises a corresponding transistor that selectively outputs the voltage VSW1 as Vsense. Controlling that transistor using the maximum voltage 17 (e.g., instead of any other lower voltage level), in an embodiment, ensures that the transistor is fully switched off (e.g., prevents partial switching off of the switch) when the voltage VSW1 is not to be sensed. This is because, using the maximum voltage 17 for switching off the transistor ensures that the voltage at the gate terminal of the transistor is at a voltage that is always equal to or higher than the voltages at the source and drain terminals of the transistor (i.e., is always equal to or higher than the voltage VSW1), thereby ensuring full turning off of the transistor. This results in no or minimal leakage current in the system 10.

Figure 4:
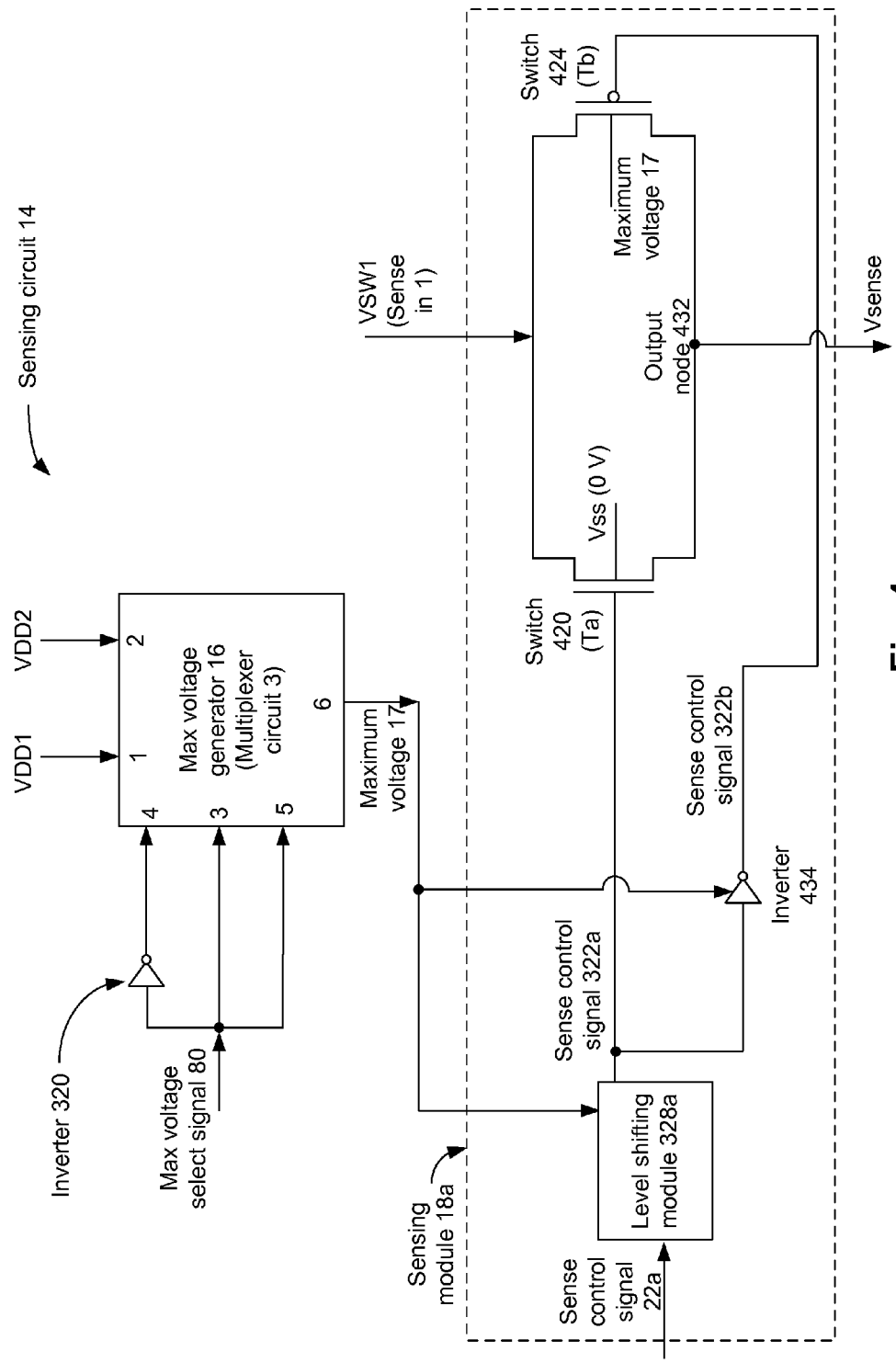
FIG. 4 schematically illustrates another example implementation of a sensing circuit.

FIG. 4 schematically illustrates another example implementation of the sensing circuit 14. Similar to FIG. 3, the sensing circuit 14 of FIG. 4 includes the maximum voltage generator 16, which is the multiplexer circuit 3. However, the sensing module 18 comprising the multiplexer circuit 5 of FIG. 3 is replaced by a sensing module 18a in the sensing circuit 14 of FIG. 4.

The sensing module 18a of FIG. 4 comprises a level shifting module 328a receiving a sense control signal 22a, which is similar to the level shifting module 328 receiving the sense control signal 22 in FIG. 3. The level shifting module 328a also receives the maximum voltage 17, similar to FIG. 3. In an embodiment, using the maximum voltage 17, the level shifting module 328a generates the sense control signal 322a, based on the logical state of the sense control signal 22a. For example, when the sense control signal 22a is at a high logical value (i.e., is 1), the level shifting module 328a outputs the maximum voltage 17 as the sense control signal 322a. On the other hand, when the sense control signal 22a is at a low logical value (i.e., is 0), the level shifting module 328a outputs a low logical value (i.e., is 0) as the sense control signal 322a.

The sensing module 18a of FIG. 4 further comprises an inverter 434, and switches 420 and 424. In an embodiment, the switches 420 and 424 comprise, for example, an N-channel transistor Ta and a P-channel transistors Tb, respectively. The inverter 434 receives the sense control signal 322a, and inverts the sense control signal 322a to generate a sense control signal 322b. The inverter 434 is powered by the maximum voltage 17, i.e., a high logical value of the sense control signal 322b corresponds to the maximum voltage 17.

In an embodiment, the sense control signals 322a and 322b are respectively coupled to the control terminals (i.e., gate terminals) of the transistors Ta and Tb, the voltage VSW1 (i.e., from the selection circuit 12) is coupled to the source terminals of the transistors Ta and Tb, and an output node 432 (e.g., which selectively outputs the voltage Vsense) is coupled to the drain terminals of the transistors Ta and Tb.

In operation, while the voltage VSW1 is to be sensed by the sensing module 18a, the sense control signal 22a is high, resulting in the sense control signal 322a being at the maximum voltage 17 and the sense control signal 322b at a low voltage. This results in the switching on of the transistors Ta and Tb, thereby supplying the voltage VSW1 to the output node 432 (i.e., the voltage Vsense is equal to the voltage VSW1, and the sensing circuit 14 senses the voltage VSW1).

On the other hand, while the voltage VSW1 is not to be sensed by the sensing module 18a, the sense control signal 22a is low, resulting in the sense control signal 322a being at a low voltage and the sense control signal 322b at the maximum voltage 17. This results in the switching off of the transistors Ta and Tb. Thus, the node 432 is floating, and the sensing circuit 14 does not sense the voltage VSW1.

As discussed, each of the sense control signals 322a and 322b are, at any given time, at a ground voltage or at the maximum voltage 17. Using the maximum voltage 17 for the sense control signals 322a and 322b ensures that the transistors Ta and Tb are fully turned on or off, as needed. For example, when the sense control signal 322b is at the maximum voltage 17, the gate voltage of the transistor Tb is always equal to or higher than the voltages at the source and drain terminals of the transistor Tb. This ensures full turning off of the transistor Tb, thereby preventing any leakage current through the transistor Tb. In another example, when the sense control signal 322a is at the maximum voltage 17, the gate voltage of the transistor Ta is always equal to or higher than the voltages at the source and drain terminals of the transistor Ta. This ensures full turning on of the transistor Ta.

In an embodiment, the transistor Ta facilitates sensing relatively low value of the voltage VSW1. For example, even when the voltage VSW1 has a relatively low value (e.g., is at or near 0 V) and the voltage VSW1 is to be sensed by the sensing circuit 14, the transistor Ta is fully turned on (as the sense control signal 322a will be the maximum voltage 17, and will be equal to or higher than the voltage VSW1), resulting in sensing of the voltage VSW1.

In an embodiment, the P-well of the N-channel transistor Ta is coupled to a voltage Vss (e.g., which is at 0 V, ground voltage, or a relatively low voltage), and the N-well of the P-channel transistor Tb is coupled to the maximum voltage 17. Coupling, for example, the N-well of the transistor Tb to the maximum voltage 17 ensures that the N-well is at a voltage that is always equal to or higher than the voltages at the source and drain terminals of the transistor Tb. This prevents leakage through any parasitic diode formed between (i) the N-well and (ii) one of the source and drain terminals of the transistor Tb.

Coupling, for example, the P-well of the transistor Ta to the voltage Vss ensures that the P-well is at a voltage that is always equal to or lower than the voltages at the source and drain terminals of the transistor Ta. This prevents leakage through any parasitic diode formed between (i) the P-well and (ii) one of the source and drain terminals of the transistor Ta.

Figure 5:
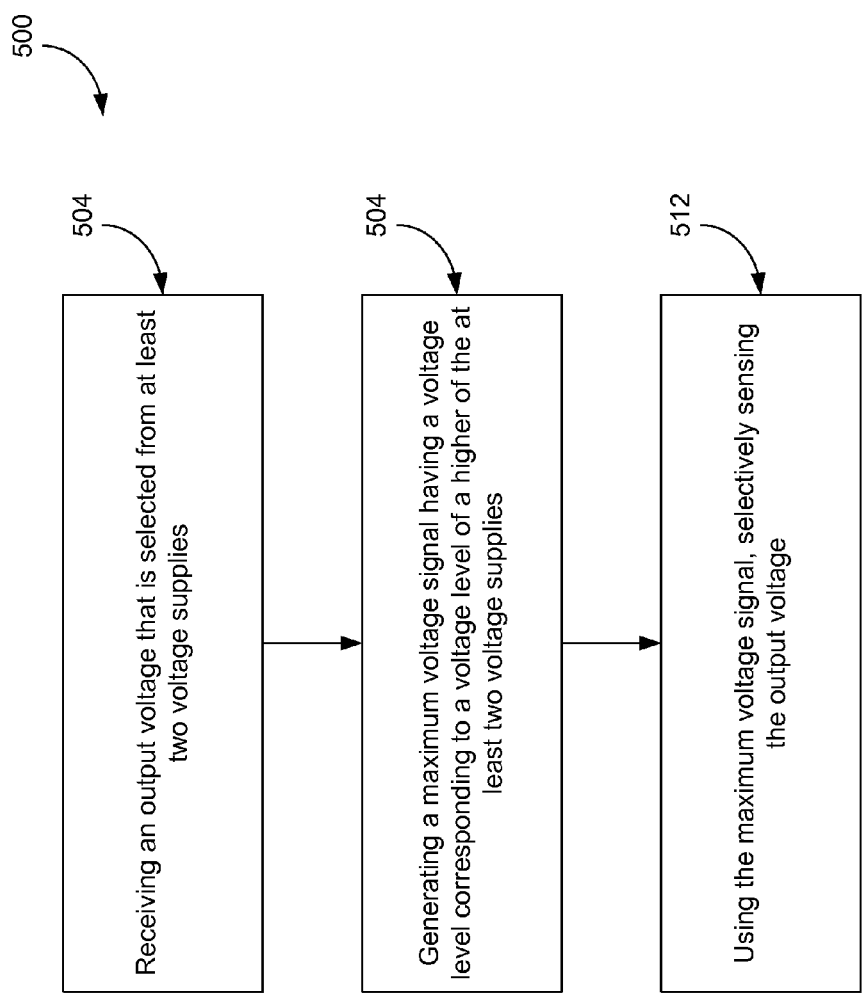
FIG. 5 is a flow diagram illustrating an example method for operating a sensing circuit.

FIG. 5 is a flow diagram illustrating an example method 500 for operating a sensing circuit. At 504, an output voltage (e.g., the voltage VSW1 that is output by the selection circuit 12) is received, where the output voltage is selected from at least two voltage supplies (e.g., voltages VDD1 and VDD2). At 508, a maximum voltage signal (e.g., the maximum voltage 17), which has a voltage level corresponding to a voltage level of a higher of the at least two voltage supplies, is generated (e.g., by the maximum voltage generator 16). At 512, using the maximum voltage signal, the output voltage is selectively sensed (e.g., by the sensing module 18 or 18a).

Figure 6:
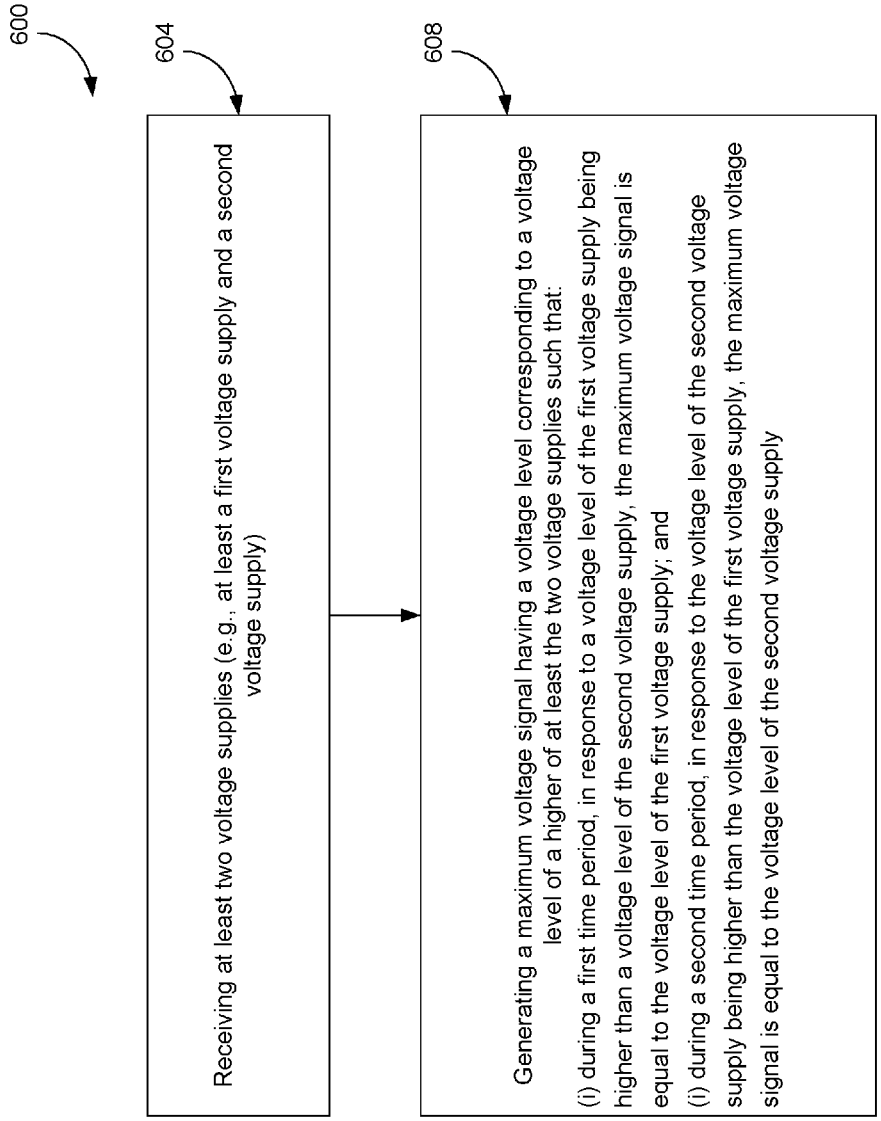
FIG. 6 is a flow diagram illustrating an example method for operating a maximum voltage generator circuit.

FIG. 6 is a flow diagram illustrating an example method 600 for operating a maximum voltage generator circuit (e.g., the maximum voltage generator circuit 16). At 604, at least two voltage supplies (e.g., voltages VDD1 and VDD2) is received by the maximum voltage generator circuit. At 608, a maximum voltage signal (e.g., the maximum voltage 17), which has a voltage level corresponding to a voltage level of a higher of the at least two voltage supplies, is generated (e.g., by the maximum voltage generator 16). For example, during a first time period, in response to a voltage level of the first voltage supply being higher than a voltage level of the second voltage supply, the maximum voltage signal is equal to the voltage level of the first voltage supply; and during a second time period, in response to the voltage level of the second voltage supply being higher than the voltage level of the first voltage supply, the maximum voltage signal is equal to the voltage level of the second voltage supply The description incorporates use of the phrases "in an embodiment," or "in various embodiments," which may each refer to one or more of the same or different embodiments. Furthermore, the terms "comprising," "including," "having," and the like, as used with respect to embodiments of the present disclosure, are synonymous.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although specific embodiments have been illustrated and described herein, it is noted that a wide variety of alternate and/or equivalent implementations may be substituted for the specific embodiment shown and described without departing from the scope of the present disclosure. The present disclosure covers all methods, apparatus, and articles of manufacture fairly falling within the scope of the appended claims either literally or under the doctrine of equivalents. This application is intended to cover any adaptations or variations of the embodiment disclosed herein. Therefore, it is manifested and intended that the present disclosure be limited only by the claims and the equivalents thereof.

What is claimed is:

1. An apparatus for sensing a voltage level of an output voltage that is selected from at least two voltage supplies, comprising:
    a selection circuit configured to (i) receive the at least two voltage supplies, (ii) select a voltage supply from among the at least two voltage supplies based on one or more control signals, and (iii) output the selected voltage supply as the output voltage;
    a maximum voltage generator circuit configured (i) to determine a voltage supply among the at least two voltage supplies that has a higher voltage level and (ii)

to output a maximum voltage signal having a voltage level corresponding to the higher voltage level, the maximum voltage generator circuit being different from the selection circuit, and the maximum voltage signal being separate from the output voltage; and a sensing module configured to (i) receive the output voltage from the selection circuit, (ii) receive the maximum voltage signal from the maximum voltage generator circuit, and (iii) selectively sense the output voltage, the sensing module comprising a switch circuit configured to apply the maximum voltage signal to completely turn off sensing of the output voltage when the output voltage is not to be sensed at the sensing module, the sensing module being different from the maximum voltage generator circuit and the selection circuit.

2. The apparatus of claim 1, wherein:
the sensing module comprises the switch circuit to selectively sense the output voltage, based on a sense control signal.

3. The apparatus of claim 1, wherein each of one or more switches of the switch circuit is controlled by one of (i) a ground voltage, or (ii) the maximum voltage signal, based on whether the output voltage is to be sensed by the sensing module.

4. The apparatus of claim 1, wherein the maximum voltage generator circuit comprises:
a first switch configured to receive a first voltage supply of the at least two voltage supplies;
a second switch configured to receive a second voltage supply of the at least two voltage supplies; and
a control circuit configured to:
determine, during a first time period, that a voltage level of the first voltage supply is higher than a voltage level of the second voltage supply, and
during the first time period, enable the first switch such that the maximum voltage signal is equal to the voltage level of the first voltage supply.

5. The apparatus of claim 4, wherein the control circuit of the maximum voltage generator circuit is further configured to:
determine, during a second time period, that a voltage level of the second voltage supply is higher than a voltage level of the first voltage supply; and
during the second time period, enable the second switch such that the maximum voltage signal is equal to the voltage level of the second voltage supply.

6. The apparatus of claim 4, wherein the control circuit of the maximum voltage generator circuit is further configured to:
receive a max voltage select signal indicating that during the first time period, the voltage level of the first voltage supply is higher than the voltage level of the second voltage supply; and
based on the max voltage select signal, enable the first switch during the first time period.

7. The apparatus of claim 1, wherein the sensing module is further configured to:
receive a first sense control signal; and
based on the first sense control signal, selectively sense the output voltage.

8. The apparatus of claim 7, wherein the sensing module is further configured to:
based on the first sense control signal, generate a second sense control signal, the second sense control signal having a voltage level equal to one of (i) the voltage level of the maximum voltage signal, and (ii) a ground voltage.

9. The apparatus of claim 8, wherein the sensing module is further configured to:
generate the second sense control signal such that (i) in response to the first sense control signal having a first value, the second sense control signal has a voltage level equal to the voltage level of the maximum voltage signal, and (ii) in response to the first sense control signal having a second value that is different from the first value, the second sense control signal has a voltage level equal to the ground voltage.

10. The apparatus of claim 8, wherein the sensing module is further configured to:
based on the second sense control signal, generate a third sense control signal, the third sense control signal having a voltage level equal to one of (i) the voltage level of the maximum voltage signal and (ii) the ground voltage.

11. The apparatus of claim 10, wherein the switch circuit comprises:
a first switch configured to (i) receive the output voltage and (ii) selectively output the output voltage as a sensed voltage, the first switch being controlled by the second sense control signal; and
a second switch configured to (i) receive the output voltage and (ii) selectively output the output voltage as the sensed voltage, the second switch being controlled by the third sense control signal.

12. The apparatus of claim 11, wherein:
the first switch comprises a N-channel transistor; and
the second switch comprises a P-channel transistor.

13. A method comprising:
selecting a voltage supply from among at least two voltage supplies;
outputting the selected voltage supply as an output voltage;
determining a voltage supply among the at least two voltage supplies that has a higher voltage level;
generating a maximum voltage signal having a voltage level corresponding to the higher voltage level, the maximum voltage signal being separate from the output voltage;
receiving, by a sensing module, the output voltage and the maximum voltage signal; and
using the maximum voltage signal in a switch circuit of the sensing module, selectively sensing, by the sensing module, the output voltage, such that the output voltage is completely turned off when the output voltage is not to be sensed at the sensing module.

14. The method of claim 13, wherein selectively sensing the output voltage further comprises:
based on a sense control signal, selectively sensing the output voltage.

15. The method of claim 13, wherein generating the maximum voltage signal further comprises:
receiving, at a first switch, a first voltage supply of the at least two voltage supplies;
receiving, at a second switch, a second voltage supply of the at least two voltage supplies;
determining, during a first time period, that a voltage level of the first voltage supply is higher than a voltage level of the second voltage supply; and
during the first time period, enabling the first switch such that the maximum voltage signal is equal to the voltage level of the first voltage supply.

16. The method of claim 15, further comprising:
determining, during a second time period, that a voltage level of the second voltage supply is higher than a voltage level of the first voltage supply; and
during the second time period, enabling the second switch such that the maximum voltage signal is equal to the voltage level of the second voltage supply.

17. The method of claim 15, wherein determining, during the first time period, that the voltage level of the first voltage supply is higher than the voltage level of the second voltage supply comprises:
receiving a max voltage select signal indicating that during the first time period, the voltage level of the first voltage supply is higher than the voltage level of the second voltage supply.

18. The method of claim 13, wherein selectively sensing the output voltage further comprises:
receiving a first sense control signal; and
based on the first sense control signal, selectively sensing the output voltage.

19. The method of claim 18, wherein selectively sensing the output voltage further comprises:
based on the first sense control signal, generating a second sense control signal, the second sense control signal having a voltage level equal to one of (i) the voltage level of the maximum voltage signal, and (ii) a ground voltage;
based on the second sense control signal, generating a third sense control signal, the third sense control signal having a voltage level equal to one of (i) the voltage level of the maximum voltage signal and (ii) the ground voltage; and
based on the second sense control signal and the third sense control signal, selectively sensing the output voltage.

20. The method of claim 19, further comprising:
receiving, at each of a first switch and a second switch, the output voltage;
selectively outputting, by each of the first switch and the second switch, the output voltage as a sensed voltage;
controlling the first switch using the second sense control signal; and
controlling the second switch using the third sense control signal.

\* \* \* \* \*